United States Patent
Lin

(10) Patent No.: US 8,962,390 B2
(45) Date of Patent: Feb. 24, 2015

(54) METHOD FOR MANUFACTURING A CHIP PACKAGING STRUCTURE

(75) Inventor: Diann-Fang Lin, Miao-Li (TW)

(73) Assignee: Dawning Leading Technology Inc., Miao-Li (TW)

( * ) Notice: Subject to any disclaimer, the term of this patent is extended or adjusted under 35 U.S.C. 154(b) by 42 days.

(21) Appl. No.: 13/327,491

(22) Filed: Dec. 15, 2011

(65) Prior Publication Data

US 2013/0065363 A1 Mar. 14, 2013

(30) Foreign Application Priority Data

Sep. 9, 2011 (TW) .............................. 100132667 A

(51) Int. Cl.
| | | |
|---|---|---|
| H01L 21/00 | (2006.01) | |
| H01L 25/16 | (2006.01) | |
| H01L 23/00 | (2006.01) | |
| H01L 25/065 | (2006.01) | |
| H01L 23/31 | (2006.01) | |

(52) U.S. Cl.
CPC ................ *H01L 25/16* (2013.01); *H01L 24/49* (2013.01); *H01L 25/0657* (2013.01); *H01L 2224/48091* (2013.01); *H01L 2224/48145* (2013.01); *H01L 2224/48227* (2013.01); *H01L 2224/48228* (2013.01); *H01L 2924/15311* (2013.01); *H01L 2224/49* (2013.01); *H01L 2224/32145* (2013.01); *H01L 2224/32225* (2013.01); *H01L 2224/73265* (2013.01); *H01L 23/3121* (2013.01); *H01L 24/16* (2013.01); *H01L 24/48* (2013.01); *H01L 24/73* (2013.01); *H01L 2223/6677* (2013.01); *H01L 2224/48265* (2013.01); *H01L 2225/0651* (2013.01); *H01L 2924/19041* (2013.01); *H01L 2924/19042* (2013.01); *H01L 2924/19104* (2013.01); *H01L 2225/06506* (2013.01); *H01L 2225/06568* (2013.01); *H01L 2224/16237* (2013.01)
USPC .................. 438/108; 438/127; 257/E21.502

(58) Field of Classification Search
None
See application file for complete search history.

(56) References Cited

U.S. PATENT DOCUMENTS

| | | | | |
|---|---|---|---|---|
| 5,953,592 A * | 9/1999 | Taniguchi et al. | ............ | 438/118 |
| 6,952,047 B2 * | 10/2005 | Li | ................ | 257/678 |
| 7,855,425 B2 * | 12/2010 | Noma | ........................ | 257/433 |
| 2002/0048951 A1 * | 4/2002 | Jeong et al. | ................... | 438/687 |
| 2002/0146863 A1 * | 10/2002 | Lin et al. | ...................... | 438/119 |
| 2004/0251523 A1 * | 12/2004 | Takiar | ......................... | 257/673 |
| 2005/0263869 A1 * | 12/2005 | Tanaka et al. | ................ | 257/686 |
| 2006/0043607 A1 * | 3/2006 | Matsuura et al. | ............ | 257/782 |
| 2006/0151206 A1 * | 7/2006 | Maruyama et al. | .......... | 174/260 |
| 2008/0265400 A1 * | 10/2008 | Pan et al. | ....................... | 257/698 |
| 2011/0111563 A1 * | 5/2011 | Yanagi et al. | ................ | 438/118 |

* cited by examiner

*Primary Examiner* — Reema Patel
(74) *Attorney, Agent, or Firm* — Tim Tingkang Xia, Esq.; Morris, Manning & Martin, LLP

(57) ABSTRACT

A method for manufacturing a chip packaging structure is disclosed. The manufacturing method includes steps of: providing a protection layer; forming a conductive trace layer on the protection layer; forming an adhesion layer on the conductive trace layer; placing a chip on the adhesion layer; and electrically connecting the chip to the conductive trace layer. Via these arrangements, the chip packaging structure made by the manufacturing method can have a smaller thickness.

7 Claims, 15 Drawing Sheets

METHOD FOR MANUFACTURING A CHIP PACKAGING STRUCTURE

CROSS-REFERENCES TO RELATED APPLICATIONS

This application claims the benefit of priority based on Taiwan Patent Application No. 100132667 filed on Sep. 9, 2011, and the disclosures of which are incorporated herein by reference in their entirety.

BACKGROUND OF THE INVENTION

1. Field of the Invention

The present invention relates to a method for manufacturing a packaging structure, and more particularly, to a method for manufacturing a chip packaging structure.

2. Descriptions of the Related Art

There are many kinds of chip packaging structures, one of which generally comprises a chip and a substrate. The chip is placed on the substrate, pads of the chip are electrically connected with a circuit of the substrate, and the chip and the substrate are optionally further encapsulated by an encapsulation. Such a chip packaging structure is disclosed in U.S. Pat. No. 7,919,851.

The aforesaid chip packaging structure has been developed for many years, so the technologies thereof are much mature and the yield is high. However, the substrate of the chip packaging structure is formed by stacking a plurality of layers of materials and thus has a larger thickness, so it is difficult to reduce the overall thickness of the chip packaging structure to a desired value. As electronic products are developing toward a thinner profile, applications of such chip packaging structures having a large thickness will be limited.

In view of this, an urgent need exists in the art to provide a method for manufacturing a chip packaging structure which can overcome at least one of the aforesaid shortcomings.

SUMMARY OF THE INVENTION

The objective of the present invention is to provide a chip packaging structure and a manufacturing method thereof. A substrate of the chip packaging structure manufactured can be made to have a significantly reduced thickness so as to reduce the thickness of the chip packaging structure.

To achieve the aforesaid objective, a chip packaging structure of the present invention comprises: a conductive trace layer; an adhesion layer disposed on the conductive trace layer; and a chip adhered on the adhesion layer and electrically connected to the conductive trace layer.

To achieve the aforesaid objective, a method for manufacturing a chip packaging structure of the present invention comprises: providing a protection layer; forming a conductive trace layer on the protection layer; forming an adhesion layer on the conductive trace layer; placing a chip on the adhesion layer; and electrically connecting the chip to the conductive trace layer.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

Figure 1:
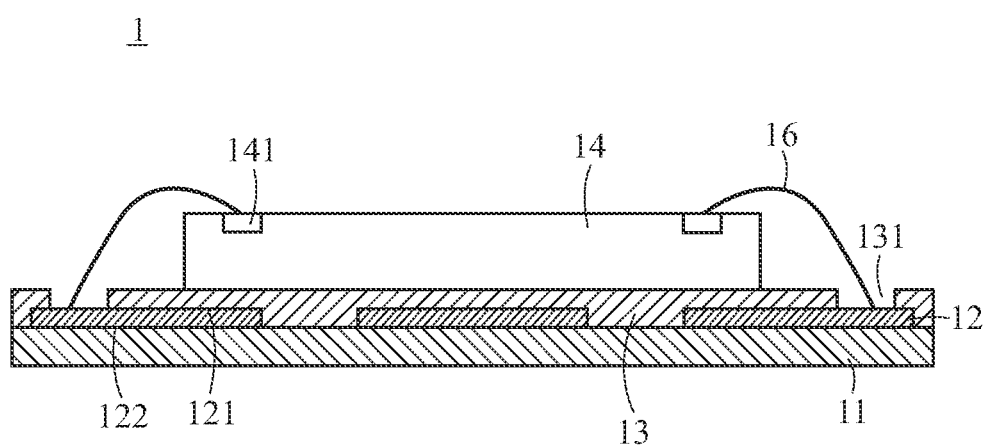
FIG. 1 is a side view of a first preferred embodiment of a chip packaging structure according to the present invention.

Referring to FIG. 1, a chip packaging structure 1 according to a first embodiment of the present invention comprises a protection layer 11, a conductive trace layer 12, an adhesion layer 13 and a chip 14, which will be described in sequence as follows.

The protection layer 11 is a base layer of the chip packaging structure 1, and can be used to support other elements of the chip packaging structure 1. The protection layer 11 is made of an electrically non-conductive (insulated) material such as a resin, ceramic or the like.

The conductive trace layer 12 is disposed on the protection layer 11; that is, the protection layer 11 is disposed under the conductive trace layer 12. The conductive trace layer 12 does not cover the entire upper surface 121 of the protection layer 11, but is formed into a particular trace pattern. The conductive trace layer 12 may be made of a metal material with good conductivity including copper or the like, and may be disposed on the protection layer 11 through printing or attachment or through a semiconductor manufacturing process (e.g., deposition, etching, and etc.) or the like.

The adhesion layer 13 is disposed on the conductive trace layer 12. In this embodiment, the adhesion layer 13 is disposed on the conductive trace layer 12 directly, so the adhesion layer 13 can make contact with or cover the conductive trace layer 12, and can further make contact with a part of the protection layer 11 that is not covered by the conductive trace layer 12. Furthermore, the adhesion layer 13 may be an adhesive and electrically non-conductive object such as an adhesive tape, a solidifiable adhesive or the like, so that the conductive trace layer 12 covered by the adhesion layer 13 will not be short-circuited.

The adhesion layer 13 further has at least one through hole 131 (two through holes in this embodiment) defined therein so that an upper surface 121 of the conductive trace layer 12 can be partly exposed through the through holes 131. Thus, other objects (e.g., metal leads or metal bumps to be described later) can pass through the through holes 131 to make contact with the upper surface 121 of the conductive trace layer 12.

The chip 14 is attached on the adhesion layer 13 so that the chip 14 cannot be easily moved with respect to the adhesion layer 13 or the conductive trace layer 12 during the manufacturing process. The chip 14 is further electrically connected to the conductive trace layer 12 so that a signal or data can be transmitted between the chip 14 and the conductive trace layer 12.

In this embodiment, the chip 14 is electrically connected to the conductive trace layer 12 by wire bonding. In detail, the chip packaging structure 1 further comprises a plurality of metal wires 16; and each of the metal wires 16 has one end welded to one of pads 141 of the chip 14 and the other end welded to the upper surface 121 of the conductive trace layer 12 exposed through the through holes 131. In this way, the pads 141 and the conductive trace layer 12 are electrically connected.

As compared with the prior art chip packaging structures, the chip packaging structure 1 of this embodiment has fewer layers (e.g., there is only the adhesion layer 13 between the conductive trace layer 12 and the chip 14), so the chip packaging structure 1 has a reduced overall thickness and is suitable for use in thin electronic products.

The chip packaging structure 1 of the first preferred embodiment has been described above. Next, other preferred embodiments of the chip packaging structure according to the present invention will be described. For simplicity of description, similarity between the other preferred embodiments and the first preferred embodiment as well as between the other preferred embodiments will not be further described.

Figure 2:
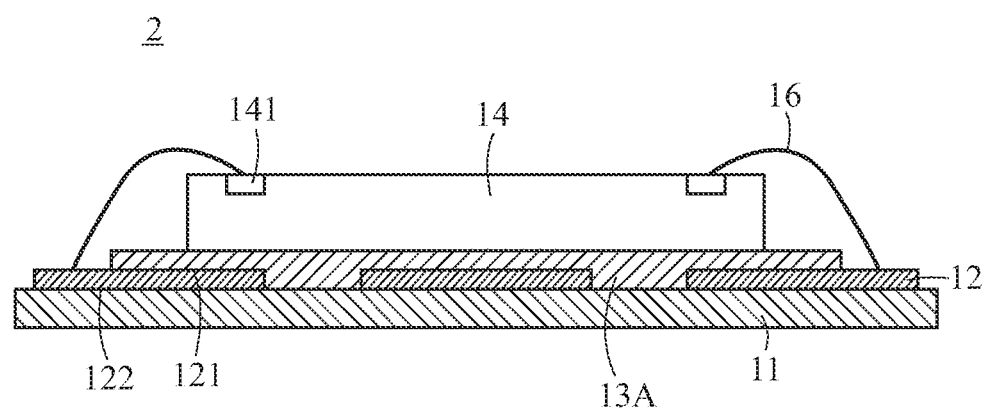
FIG. 2 is a side view of a second preferred embodiment of a chip packaging structure according to the present invention.

Referring to FIG. 2, a chip packaging structure 2 of a second preferred embodiment according to the present invention differs from the chip packaging structure 1 in that: it is unnecessary to define a through hole in an adhesion layer 13A of the chip packaging structure 2.

In detail, the adhesion layer 13A is disposed on a part of the conductive trace layer 12 and may be distributed only under the chip 14 (without the need of covering the entire conductive trace layer 12). In this way, the conductive trace layer 12 that is not covered by the adhesion layer 13A can be subjected to the subsequent processes directly. Moreover, because the need of an additional process for forming a through hole is eliminated, the manufacturing time and cost of the chip packaging structure 2 are also reduced.

Figure 3:
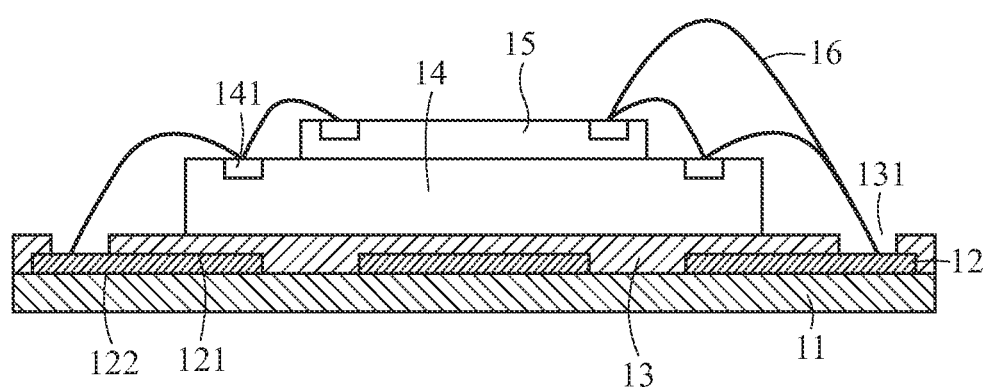
FIG. 3 is a side view of a third preferred embodiment of a chip packaging structure according to the present invention.

As shown in FIG. 3, a chip packaging structure 3 according to a third preferred embodiment of the present invention differs from the chip packaging structures 1, 2 in that: the chip packaging structure 3 further comprises a transfer element 15.

The transfer element 15 is disposed on the chip 14, and can be electrically connected to the chip 14 or the conductive trace layer 12 by wire bonding. Another adhesion layer (not shown) may also be disposed between the transfer element 15 and the chip 14 to make it hard for the transfer element 15 to move with respect to the chip 14 during the manufacturing process. The transfer element 15 may be an element that can transmit electric energy such as a circuit board (e.g., a flexible circuit board, a ceramic circuit board, etc.) or a chip. Furthermore, electronic elements such as an antenna, a capacitor or an inductor may be formed or comprised in or on the transfer element 15 to add to functions of the transfer element 15.

Figure 4:
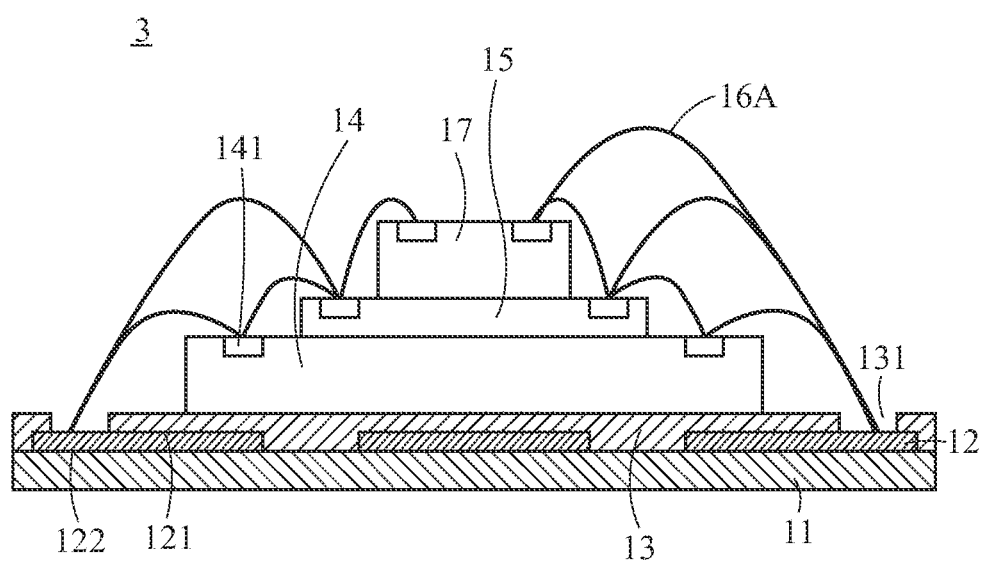
FIG. 4 is another side view of the third preferred embodiment of the chip packaging structure according to the present invention.

FIG. 4 discloses another side view of the third preferred embodiment of the chip packaging structure 3 according to the present invention. The transfer element 15 may allow another chip 17 to be disposed thereon. Because the transfer element 15 can transmit electric energy to the chip 14 or the conductive trace layer 12, electric energy from the chip 17 can be transmitted by the transfer element 15 to the chip 14 or the conductive trace layer 12. In other words, no metal wire is needed to electrically connect the chip 17 and the conductive trace layer 12, so metal wire 16A shown in FIG. 4 may be omitted in practice. When the metal wire 16A is omitted, the overall height of the chip packaging structure 1 can be reduced significantly. Therefore, the transfer element 15 can reduce the overall packaging height of the chip packaging structure 1.

Figure 5:
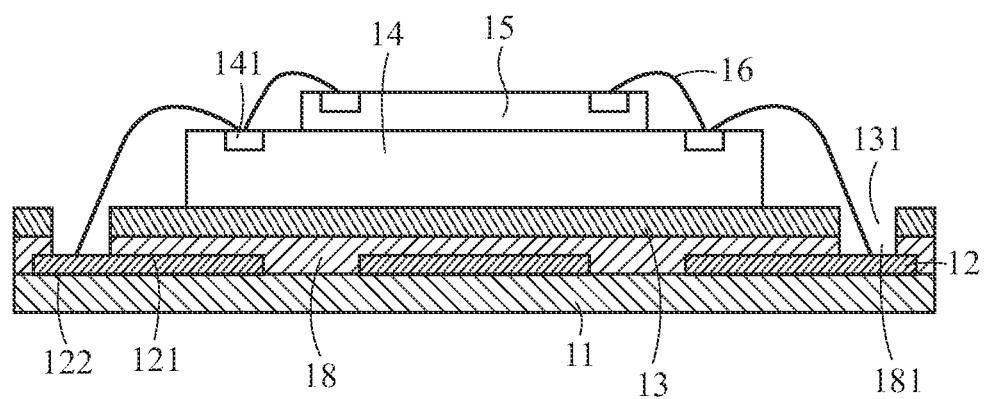
FIG. 5 is a side view of a fourth preferred embodiment of a chip packaging structure according to the present invention.

Referring to FIG. 5, a chip packaging structure 4 according to a fourth preferred embodiment differs from the chip packaging structures 1 to 3 in that: the chip packaging structure 4 further comprises an insulation layer 18.

In detail, the insulation layer 18 is disposed between the conductive trace layer 12 and the adhesion layer 13 so that the adhesion layer 13 is indirectly disposed on the conductive trace layer 12. The insulation layer 18 may cover the entire conductive trace layer 12, and also has through holes 181 defined therein to expose a part of the upper surface 121 of the conductive trace layer 12.

Figure 6:
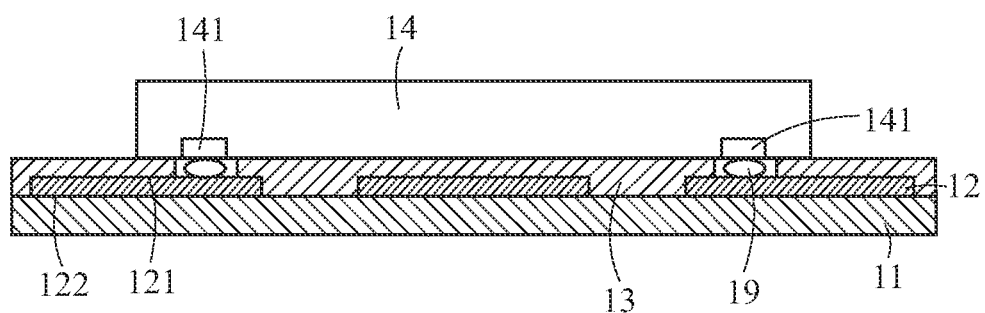
FIG. 6 is a side view of a fifth preferred embodiment of a chip packaging structure according to the present invention.

Referring to FIG. 6, a chip packaging structure 5 according to a fifth preferred embodiment of the present invention differs from the chip packaging structures 1 to 4 in that: the chip 14 is electrically connected to the conductive trace layer 12 by flip chip.

In detail, the chip packaging structure 5 may comprise a plurality of metal bumps 19 disposed in the through holes 131 of the adhesion layer 13 and on the upper surface 121 of the conductive trace layer 12; and the pads 141 of the chip 14 face towards the upper surface 121 of the conductive trace layer 12. In this way, the metal bumps 19 can make contact with both the pads 141 of the chip 14 and the upper surface 121 of the conductive trace layer 12 so as to connect the pads 141 with the conductive trace layer 12.

Figure 7:
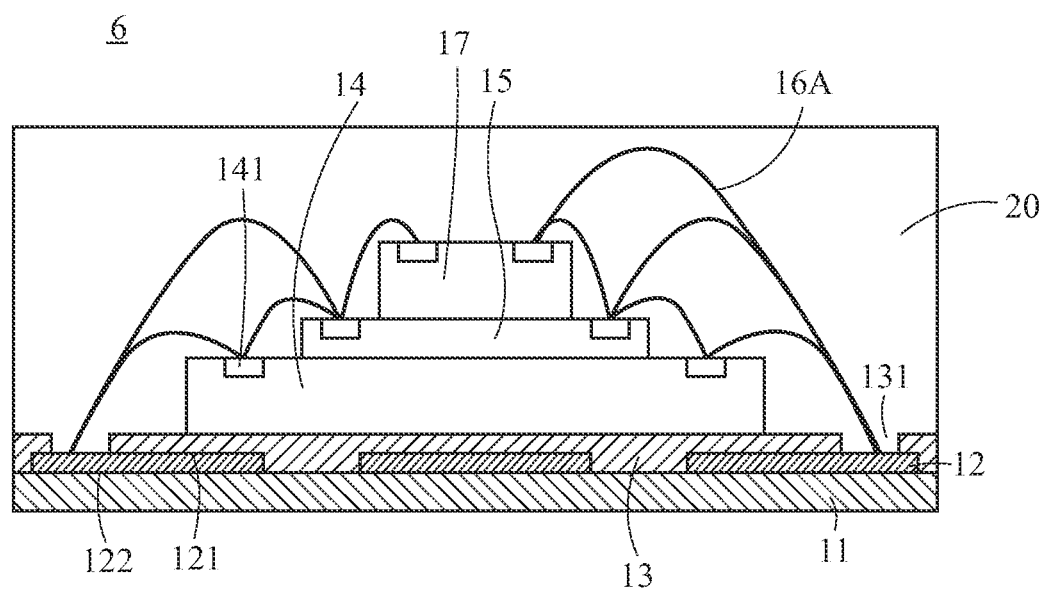
FIG. 7 is a side view of a sixth preferred embodiment of a chip packaging structure according to the present invention.

Referring to FIG. 7, a chip packaging structure 6 according to a sixth preferred embodiment of the present invention differs from the chip packaging structures 1 to 5 in that: the chip packaging structure 6 further comprises an encapsulation 20. The encapsulation 20 can encapsulate at least the chip 14, the adhesion layer 13 and the conductive trace layer 12. If the chip packaging structure 6 comprises the transfer element 15, the chip 17, the metal wires 16 or the metal bumps 19, the encapsulation 20 may also encapsulate these elements together. The objects encapsulated by the encapsulation 20 will be less prone to influences from the external environment.

Figure 8:
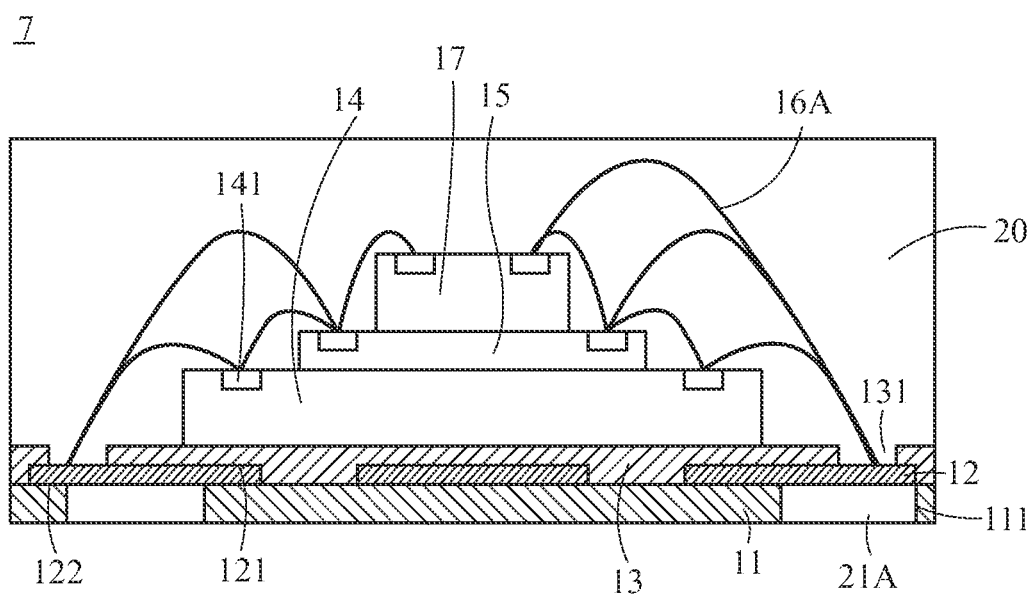
FIG. 8 is a side view of a seventh preferred embodiment of a chip packaging structure according to the present invention.
Figure 9:
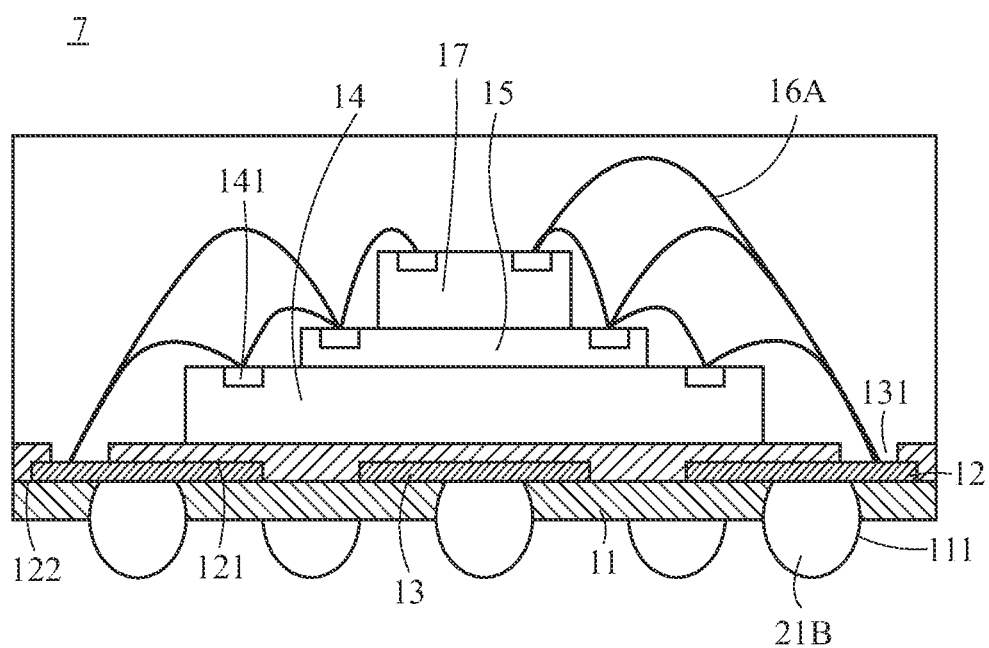
FIG. 9 is another side view of the seventh preferred embodiment of the chip packaging structure according to the present invention.

Referring to FIG. 8 and FIG. 9, a side view of a seventh preferred embodiment of the chip packaging structure according to the present invention is shown therein respectively. The chip packaging structure 7 of the seventh preferred embodiment differs from the chip packaging structures 1 to 6 in that: the protection layer 11 of the chip packaging structure 7 has at least one through hole 111 defined therein to partly expose a lower surface 122 of the conductive trace layer 12 through the through hole 111.

Furthermore, the chip packaging structure 7 further comprises at least one conductive material 21A (as shown in FIG. 8) or metal bump 21B (as shown in FIG. 9), which is disposed in the through hole 111 of the protection layer 11 and makes contact with the lower surface 122 of the conductive trace layer 12. In this way, the conductive material 21A (or the metal bump 21B) can act as a medium for connecting the chip packaging structure 7 with external electronic elements or circuit boards (not shown). It shall be appreciated that, the conductive material 21A may be slightly thicker than the protection layer 11.

Figure 10:
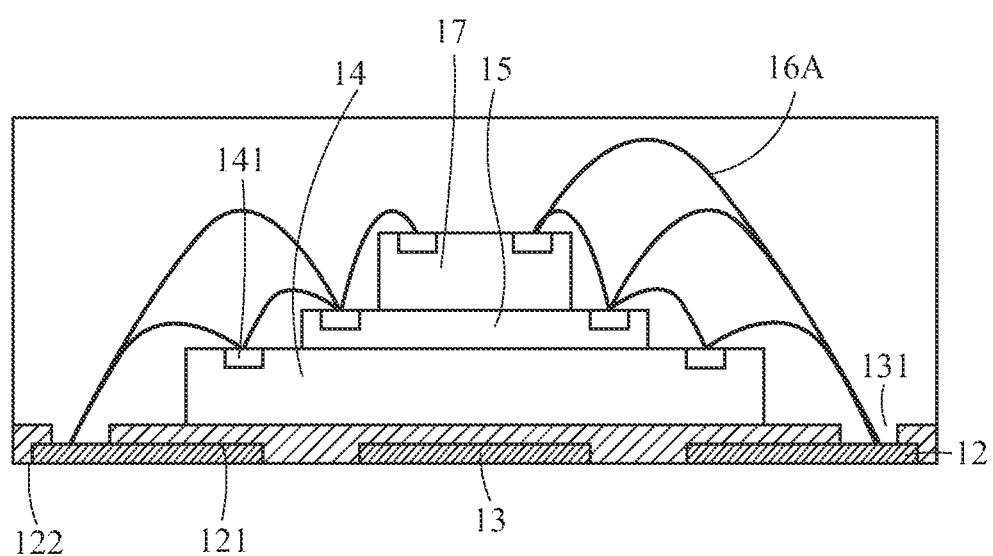
FIG. 10 is a side view of an eighth preferred embodiment of a chip packaging structure according to the present invention.

Referring to FIG. 10, a chip packaging structure 8 according to an eighth preferred embodiment of the present invention differs from the chip packaging structures 1 to 6 in that: the chip packaging structure 8 does not comprise the protection layer 11, so the entire lower surface 122 of the conductive trace layer 12 can be exposed. In this way, the lower surface 122 of the conductive trace layer 12 can directly act as a medium for connecting the chip packaging structure 8 with external electronic elements or circuit boards (not shown). Furthermore, because the protection layer 11 is omitted, the thickness of the chip packaging structure 8 can be further reduced.

The embodiments of the chip packaging structure according to the present invention have been described above. Next, a method for manufacturing a chip packaging structure of the present invention will be described, and at least the chip packaging structures 1 to 8 can be manufactured by this method. However, it shall be appreciated that, the chip packaging structure of the present invention is not limited to be manufactured by the method for manufacturing a chip packaging structure of the present invention.

Figure 11:
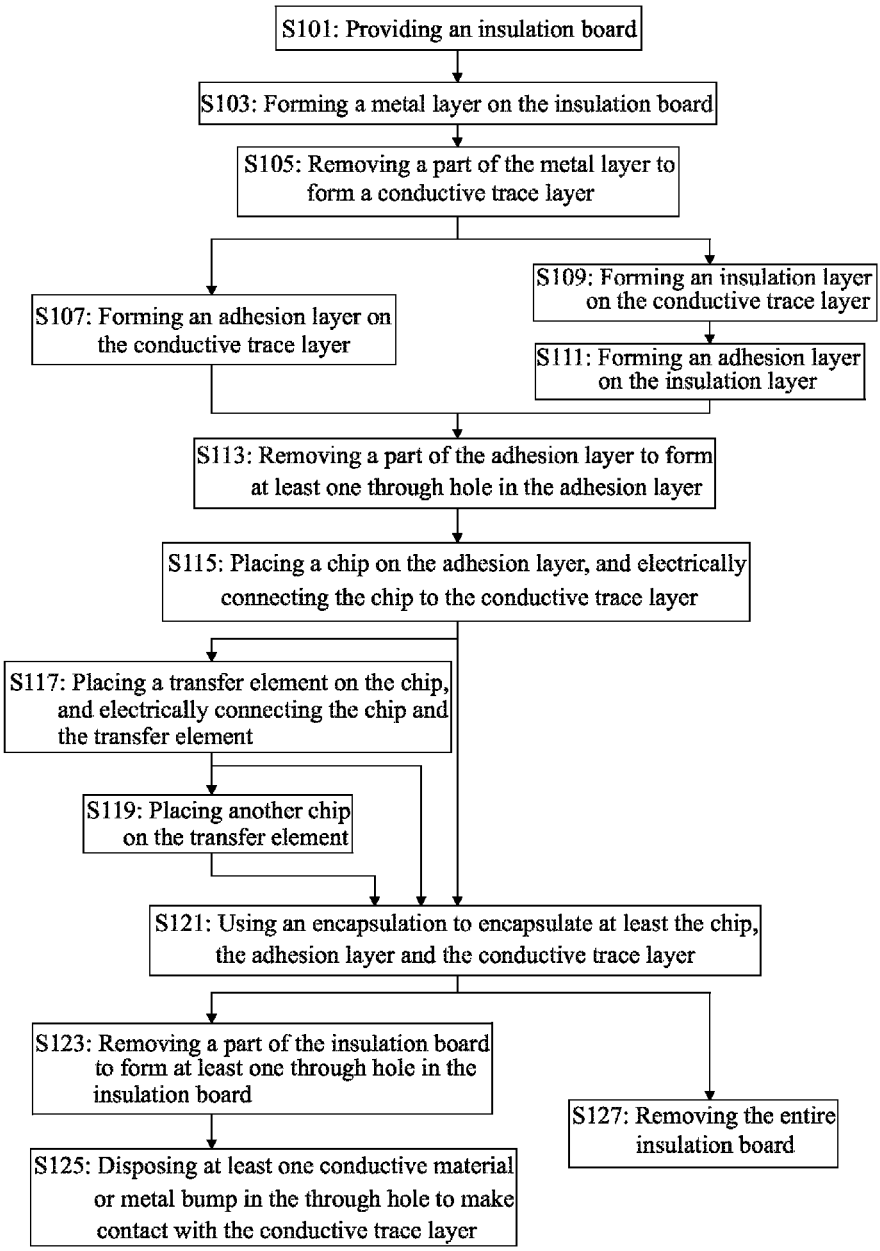
FIG. 11 is a flowchart diagram of a first preferred embodiment of a method for manufacturing a chip packaging structure according to the present invention.
Figure 12A:
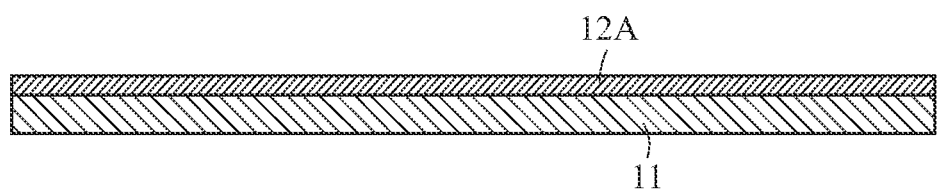
FIG. 12A is a schematic view illustrating a step S101 of FIG. 11.

FIG. 11 discloses a flowchart diagram of a first preferred embodiment of the method for manufacturing a chip packaging structure according to the present invention. Referring to FIG. 12A to FIG. 12D, a schematic view illustrating one of steps of FIG. 11 is shown therein respectively. The method for manufacturing a chip packaging structure of this embodiment may start from a step S101 in which a protection layer 11 is provided firstly (as shown in FIG. 12A).

Figure 12B:
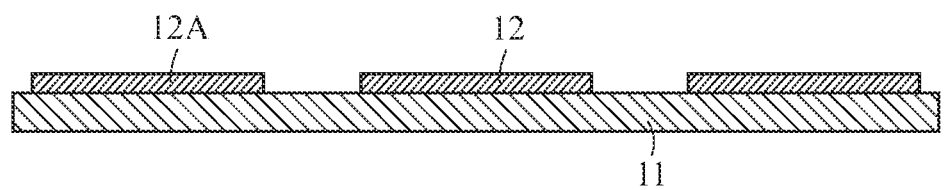
FIG. 12B is a schematic view illustrating a step S105 of FIG. 11.

Next, a metal layer 12A is formed on the protection layer 11 (step S103), and then a part of the metal layer 12A is removed through etching or the like (step S105, as shown in FIG. 12B). The remaining parts of the metal layer 12A that are not removed can form a particular trace pattern (i.e., a conductive trace layer 12). In addition to the steps S103 and S105, the conductive trace layer 12 may also be formed on the protection layer 11 in other ways, for example, through printing.

Figure 12C:
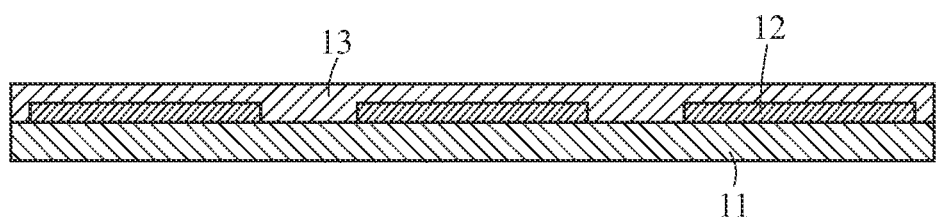
FIG. 12C is a schematic view illustrating a step S107 of FIG. 11.

After the conductive trace layer 12 is formed, an adhesion layer 13 may be formed on the conductive trace layer 12 (step S107, as shown in FIG. 12C). The adhesion layer 13 may be formed on the conductive trace layer 12 directly to make contact with the conductive trace layer 12 as well as a part of the protection layer 11 that is not covered by the conductive trace layer 12.

Figure 12D:
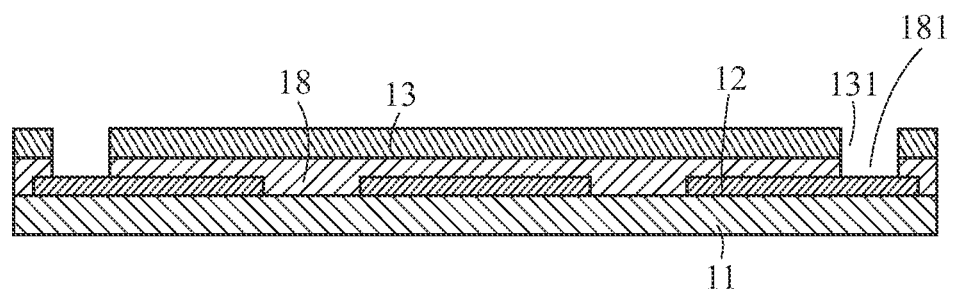
FIG. 12D is a schematic view illustrating a step S111 of FIG. 11.

Alternatively, after the conductive trace layer 12 is formed, an insulation layer 18 is firstly formed on the conductive trace layer 12 (step S109, as shown in FIG. 12D) and then an adhesion layer 13 is formed on the insulation layer 18 (step S111, as shown in FIG. 12D) so that the adhesion layer 13 is formed on the conductive trace layer 12 indirectly.

After the adhesion layer 13 is formed on the conductive trace layer 12 directly or indirectly, a part of the adhesion layer 13 is removed through etching or the like to form at least one through hole 131 in the adhesion layer 13 (step S113, as shown in FIG. 1). In this way, an upper surface 121 of the conductive trace layer 12 may be partly exposed through the through hole 131 to facilitate subsequent electrical connection between the conductive trace layer 12 and the chip 14. If the adhesion layer 13 is formed on only a part of the conductive trace layer 12 (as shown in FIG. 2), then there is no need to additionally remove a part of the adhesion layer 13; that is, the step S113 may be omitted optionally.

Next, a chip 14 is placed on the adhesion layer 13 to be adhered to the adhesion layer 13, and then the chip 14 is electrically connected to the conductive trace layer 12 by wire bonding or flip chip (step S115, as shown in FIG. 1 or FIG. 6).

After the chip 14 is coupled to the conductive trace layer 12, a transfer element 15 may be placed on the chip 14, and the chip 14 and the transfer element 15 are electrically connected by wire bonding or flip chip (step S117, as shown in FIG. 3). Thereafter, another chip 17 may be placed on the transfer element 15 (step S119, as shown in FIG. 4), and the chip 17 is electrically connected to the transfer element 15, the chip 14 and/or the conductive trace layer 12.

After the step S115, S117 or S119, the chip packaging structure completed so far may be placed into a mould (not shown), and then an encapsulation 20 is filled therein. After the encapsulation 20 is solidified, the encapsulation 20 can encapsulate at least the chip 14, the adhesion layer 13 and the conductive trace layer 12 (step S121, as shown in FIG. 7). If the chip 17 or the transfer element 15 is present, the encapsulation 20 may also encapsulate the chip 17 or the transfer element 15 together.

It shall be appreciated that, if the chip packaging structure to be manufactured does not require use of the encapsulation 20, then the step S121 can be omitted.

After the encapsulation 20 is solidified, a part of the protection layer 11 may be removed to form at least one through hole 11 in the protection layer 11 (step S123, as shown in FIG. 8 or FIG. 9). In this way, a lower surface 122 of the conductive trace layer 12 can be partly exposed through the through hole 111. Then, at least one conductive material 21A or metal bump 21B may be disposed in the through hole 111 in such a way that the conductive material 21A or the metal bump 21B makes contact with the conductive trace layer 12 (step S125, as shown in FIG. 8 or FIG. 9).

Alternatively, after the encapsulation 20 is solidified, the entire protection layer 11 may be removed to expose the entire lower surface 122 of the conductive trace layer 12 (step S127, as shown in FIG. 10).

Various chip packaging structures can be manufactured by the aforesaid method for manufacturing a chip packaging structure.

According to the above descriptions, the chip packaging structure and the method for manufacturing a chip packaging structure of the present invention have at least the following features:

1. because only an adhesion layer is disposed between a chip and a conductive metal layer, the chip packaging structure can have a reduced overall thickness so as to be used in electronic products having a small thickness;
2. the chip packaging structure may comprise a transfer element so as to reduce the wire-bonding distance and the wire-bonding height of the chip; and the transfer element may comprise elements such as an antenna, a capacitor or an inductor to extend functions of the chip packaging structure;
3. the chip packaging structure may not comprise the protection layer, which further reduces the thickness of the chip packaging structure; and
4. the method for manufacturing a chip packaging structure can be implemented easily.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A method for manufacturing a chip packaging structure, comprising:
    providing a protection layer;
    forming a conductive trace layer on the protection layer;
    forming an adhesion layer on the conductive trace layer;
    removing a part of the adhesion layer to form at least one through hole in the adhesion layer, so that an upper surface of the conductive trace layer is partly exposed through the through hole;
    disposing at least one metal bump in the through hole to be in contact with the conductive trace layer after the formation of the through hole;
    placing a chip on the adhesion layer to be in contact with the metal bump being disposed in the through hole;
    electrically connecting the chip to the conductive trace layer through the metal bump in the through hole;
    placing a transfer element on top of the chip;
    electrically connecting the chip and the transfer element;
    utilizing an encapsulation to encapsulate the chip, the adhesion layer, the conductive trace layer and the transfer element; and
    removing the entire protection layer.

2. The method of claim 1, wherein the adhesion layer is directly formed on the conductive trace layer to be in contact with the conductive trace layer.

3. The method of claim 1, further comprising:
    forming an insulation layer on the conductive trace layer; and
    forming the adhesion layer on the insulation layer.

4. The method of claim 1, wherein the adhesion layer is formed on a part of the conductive trace layer.

5. The method of claim 1, wherein the step of forming a conductive trace layer on the protection layer further comprises:
    forming a metal layer on the protection layer; and
    removing a part of the metal layer to form the conductive trace layer.

6. A method for manufacturing a chip packaging structure, comprising:
    providing a protection layer;
    forming a conductive trace layer on the protection layer;
    forming an adhesion layer on the conductive trace layer;
    removing a part of the adhesion layer to form at least one through hole in the adhesion layer, so that an upper surface of the conductive trace layer is partly exposed through the through hole;
    disposing at least one metal bump in the through hole to be in contact with the conductive trace layer after the formation of the through hole;
    placing a chip on the adhesion layer to be in contact with the metal bump being disposed in the through hole;
    electrically connecting the chip to the conductive trace layer through the metal bump in the through hole;
    placing a transfer element on top of the chip;
    electrically connecting the chip and the transfer element;
    utilizing an encapsulation to encapsulate the chip, the adhesion layer, the conductive trace layer and the transfer element; and
    removing a part of the protection layer to form at least one through hole in the protection layer, so that a lower surface of the conductive trace layer is partly exposed from the through hole of the protection layer.

7. The method of claim 6, further comprising: disposing at least one conductive material or metal bump in the through hole of the protection layer to be in contact with the conductive trace layer.

* * * * *